United States Patent [19]

Spence et al.

[11] Patent Number: 5,440,566
[45] Date of Patent: Aug. 8, 1995

[54] FAULT DETECTION AND DIAGNOSIS FOR PRINTED CIRCUIT BOARDS

[75] Inventors: Hugh F. Spence; Daniel P. Burris, both of San Antonio; Robert A. Houston, Somerset, all of Tex.

[73] Assignee: Southwest Research Institute, San Antonio, Tex.

[21] Appl. No.: 224,658

[22] Filed: Apr. 6, 1994

Related U.S. Application Data

[63] Continuation of Ser. No. 763,954, Sep. 23, 1991, abandoned.

[51] Int. Cl.⁶ ...................... G01R 31/00; G01N 21/84
[52] U.S. Cl. ......................................... 374/41; 356/73; 356/394; 364/481; 364/550; 364/571.02
[58] Field of Search .............. 356/73, 394; 364/481, 364/550, 571.02; 371/15.1; 374/41

[56] References Cited

U.S. PATENT DOCUMENTS

| | | | |
|---|---|---|---|
| 3,991,302 | 11/1976 | Danner | 364/481 |
| 4,692,690 | 9/1987 | Hara et al. | 324/73.1 |
| 4,814,870 | 3/1989 | Crall | 358/113 |
| 4,890,245 | 12/1989 | Yomoto et al. | 364/557 |
| 4,974,182 | 11/1990 | Tank | 364/557 |
| 4,979,134 | 12/1990 | Arima et al. | 364/557 |
| 5,235,400 | 8/1993 | Terasawa et al. | 356/237 |

OTHER PUBLICATIONS

Lloyd G. Allred, "Application of Infra-Red Camera Technology to Automatic Test Equipment", Memorandum, pp. 1–3, undated memo.

Lloyd G. Allred, Larry V. Kirkland, "Interactive SRU Diagnosis Using Neural Networks", 1990 IEEE, pp. 175–180.

Lloyd G. Allred, "Neural Radiant Energy Detection System", Memorandum, pp. 1–2, undated, publication unknown.

Lloyd G. Allred, "Neural Networks in Automatic Testing of Diode Protection Circuits", 1989 IEEE, pp. 181–186.

Jerry Murray, "Looking into the SMD Solder Joint . . . Deeply", *Circuits Manufacturing,* Jan. 1987, pp. 48–54.

Lloyd G. Allred, "Neural Fault Detection System", pp. 1–2, hand out at conference, date unknown.

John Miner, "A Thermal Management Process for Electronic System Maintenance", publication unknown, 1990; pp. i-1-i-9;1-1-10;2-1-2-17;3-1-3-8;-4-1-4-5;5-1-5-14;6-1-6-3.

John R. Tower, "PtSi Thermal Imaging Systems: A New Level of Performance and Maturity", *Photonics Spectra,* Apr. 1991, pp. 91–97.

Hughes, Subsidiary of GM Hughes Electronics, "Thermography Enters the Information Age", publication and date unknown, pp. 1–6.

U.S. Army Depot System Command, "Infrared Thermal Imaging Technology Study", *Technical Report No. 90–1,* Jun. 1990, publication unknown.

Dennis Dresser, "IR Imaging for PCB Testing", *Advanced Imaging,* Apr. 1990, pp. 46–69.

R. Barry Johnson, Chen Feng, Joseph D. Fehribach, "On the Validity and Techniques of Temperature and Emissivity Measurements", *SPIE Proc. 934,* (1988), pp. 202–206.

Gianni Barani, Alessandro Tofani, "Comparison of Some Algorithms Commonly Used in Infrared Pyrometry: A Computer Simulation", *SPIE vol. 1467 Thermosense XIII* (1991), pp. 458–468.

(List continued on next page.)

*Primary Examiner*—Edward R. Cosimano
*Attorney, Agent, or Firm*—Baker & Botts

[57] ABSTRACT

A method for detecting an diagnosing faults in printed circuit boards. Emissivity data and thermal image data of the various components of the board are obtained. The emissivity data is used to correct the thermal image data. The corrected data is converted to device space data, which is then input to a previously trained neural network. The output of the neural network indicates the location of the fault. The method includes an improved method for obtaining an emissivity map and a method for providing suitable neural network input.

13 Claims, 1 Drawing Sheet

OTHER PUBLICATIONS

Herbert Kaplan, "Infrared Thermal Imaging Diagnostics–the New Software", *Laser Focus/Electro-Optics,* Nov. 1987, pp. 150–157.

Jonathan W. Martin, Mary E. McKnight, Dale P. Bentz, "Thermographic Imaging and Computer Image Processing of Defects in Buiding Materials", *SPIE vol. 581 Thermosense VIII* (1986), pp. 152–155.

C. G. Masi, "Finding Board Faults with Thermal Imaging", i Test & Measurement World/Mar. 1989, pp. 109–120.

Richard F. Crall, "Thermal Imaging: Benchtop Analysis for Reliability", *Evaluation Engineering–Dec. 1989,* pp. 74–77.

Richard Comerford, "New Uses for Thermal Imaging in Board Test", *Electronics Test,* Aug. 1990, pp. 26–29.

William M. Silver, "Golden Template Comparison", *Sensors, Oct. 1990,* pp. 20–26.

Elio Capra, "Printed Circuit Board Failure Analysis Using Infrared Thermography", Hughes Aircraft Company Application Note, pp. 1–3, date unknown.

Dr. Richard F. Crall, "Thermal Imaging as a Test Technology", Cimpix Inforporated, pp. 1–6, publication and date unknown.

Daniel K. Fike, "Using Infrared Thermography as a Manufacturing Tool to Analyze and Repair Defects in Printed Circuit Boards", *SPIE vol. 1467 Thermosense XIII* (1991), pp. 150–153.

Bo Wallin, "Real-Time Temperature Measurement on PCB:s, Hybrids and Microchips", *SPIE vol. 1467 Thermosense XIII* (1991), pp. 180–187.

Author unknown, "Thermographic Mapping of PC Boards", *NASA Preferred Reliability Practices, Practice No. PT-TI-1403,* pp. 1–4, publication and date unknown.

Phil Douglas, Al Johnson, Mark Mixter, "Continuous–Flow ESS Minimizes Defects", *Electronics Test Aug. 1990,* pp. 42–45.

Author unknown, "Thermal Resistance–A Reliability Consideration", publication and date unknown, pp. 13–21.

Torbjorn Hamrelius, "Accurate Temperature Measurement in Thermography. An Overview of Relevant Features, Parameters and Definitions", *SPIE vol. 1467 Thermosense XIII* (1991), pp. 448–457.

Herbert Kaplan, Perry Hugo, Roy Zelenka, "The Infrared Automatic Mass Screening (IRAMS) System for Printed Circuit Board Diagnostics", IEEE, 1986, pp. 301–306.

Richard Q. Moy, "Predicting Electronic Component Lifetime Using Thermography", *SPIE vol. 1467 Thermosense XIII* (1991), pp. 154–160.

F. A. Rosell, Larry Gibson, "Measuring System Performance Characteristics of Infrared Systems (MRT, MTF, NETD) Using Automatic Test Equipment", IEEE 1989, pp. 236–241.

John R. Snell, Jr. Robert W. Spring, "Surveying the Elements of Successful Infrared Predictive Maintenance Programs (and Appendix A)", *SPIE vol. 1467 Thermosense XIII* (1991), pp. 2–10.

Joseph D. Fehribach, R. Barry Johnson, "Temperature Measurement Validity for Dual Spectral-Band Radiometric Techniques", *Optical Engineering,* Dec. 1989, vol. 28, No. 12, pp. 1255–1259.

FAULT DETECTION AND DIAGNOSIS FOR PRINTED CIRCUIT BOARDS

CROSS REFERENCE TO RELATED APPLICATIONS

This application is a continuation of application Ser. No. 07/763,954 filed Sep. 23, 1991, entitled "Fault Detection and Diagnosis for Printed Circuit Boards" by High F. Spence, Daniel P. Burris and Robert A. Houston, now abandoned.

TECHNICAL FIELD OF THE INVENTION

This invention relates to electronic test equipment, and more particularly to an apparatus for testing printed circuit boards using thermographic imaging.

BACKGROUND OF THE INVENTION

As electronic circuits have become more complex, advances have been made in testing them for faults. Automatic test equipment (ATE) systems have been developed to make specified measurements on electronic circuits and to interpret the results to locate and identify failures.

Printed circuit boards (PCB's) have become especially difficult to test because of the number of components and the difficulty of isolating and accessing them. Traditional guided probing techniques become especially problematic, especially in terms of time consumption, when testing PCB's. One attempt to make the testing more efficient is the use of "bed of nails" test fixtures, which gain access to internal nodes of a circuit board simultaneously. However, even these techniques have not completely overcome problems associated with isolating components and testing their interaction. Also, the fixturing is difficult especially for PCB's having surface mounted devices, coatings, or double sided mounting.

A recent alternative to guided probing and bed of nails testing has been the use of thermographic imaging. Infrared energy emitting from an operating PCB under test produces a unique thermographic image which can be compared with the image of a PCB that is known to be in good operation.

A problem with existing infrared testing systems for PCB's is that the thermal images have required subjective interpretation by a skilled technician. These interpretation difficulties have prevented wide use of thermal information for ATE testing.

Another problem with existing infrared red testing systems is that it is difficult to accurately determine the emissivity of the circuit board under test. Emissivity is a measure of a surface's ability to radiate energy, referenced to that of a perfect, or "blackbody" surface. To accurately determine the temperature of an object from measurements of radiated energy, the emissivity of the object's surface must be known. The problem of determining temperature is made more difficult when the object has areas of different emissivity, such as is the case with PCB's where the devices on the PCB may be plastic, ceramic, bare metal or treated metal. Even components of the same type may have different emissivities on different PCB's.

A need exists for an improved, easy to use, method for producing and diagnosing thermographic images.

SUMMARY OF THE INVENTION

One aspect of the invention is a method for detecting and diagnosing faults of a printed circuit board. The circuit board is placed in a controlled environment, such that environmental radiation is minimized. Power is supplied to the circuit board to simulate operation of its components. Emissivity data representing the emissivities of the components is obtained, as well as a thermal image of the circuit board while under power. The thermal image is corrected for varying emissivities of the PCB components, such that a emissivity-corrected thermal image is obtained. Data from this corrected thermal image is input to an artificial neural network, which has been previously trained such that thermographic input results in certain output representing a known fault.

In the preferred embodiment, the image is preprocessed, such that the thermal data is converted to device space data, in which particular locations are associated with a thermal feature at that location for input to the neural network. The neural network is trained with a fault list, in which certain thermographic input data is associated with outputs representing component faults. The neural network has an input layer for receiving thermal image data, a hidden layer for applying weight values associated with temperature profiles of known failed components, and an output layer for indicating failed components of a circuit board under test. The weights of the hidden layer may be adjusted during training in accordance with the fault list.

An improved method for obtaining emissivity data of the circuit board involves capturing a first thermal image while the circuit board is in thermal equilibrium, capturing a second thermal image while the circuit board is illuminated, calculating a difference image between the first and the second images, and using this difference image to determine an emissivity map of at various points on the circuit board. Equations for determining the emissivity map are described herein.

A technical advantage of the invention is that efficient testing of PCB's and diagnosis of their faults may be accomplished in a rapid and low cost manner. Speed of testing is improved by the ability to rapidly locate components that, when failed, cause changes in the temperature profile of the PCB. Rules and relationships for associating thermal features to physical faults may be easily developed.

COPYRIGHT INFORMATION

A portion of the disclosure of this patent document contains material which is subject to copyright protection. The copyright owner has no objection to the facsimile reproduction by any one of the patent disclosure, as it appears in the Patent and Trademark Office files or records, but otherwise reserves all copyright rights whatsoever.

DETAILED DESCRIPTION OF THE INVENTION

Figure 1:
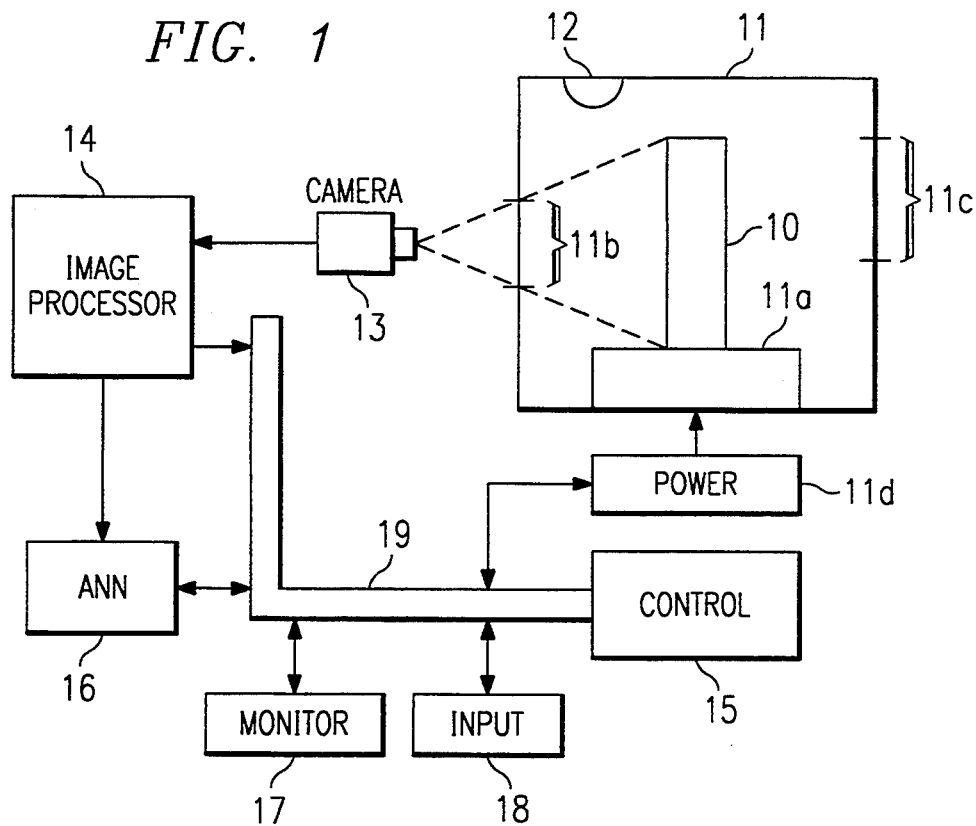
FIG. 1 is a block diagram of an ATE system with units for thermal imaging and neural network interpretation.

FIG. 1 is a block diagram of an automatic test equipment (ATE) system in accordance with the invention. The main components of the system are a test enclosure 11, an infrared source 12, an infrared camera 13, an image processing unit 14, a control computer 15, and an artificial neural network unit 16.

In alternative embodiments, the tasks performed by image processing unit 14, control unit 15, and neural network 16 could be performed on a single computer system, programmed for these various tasks.

Although the system of FIG. 1 is illustrated as a stand-alone system, it could also be used in conjunction with a more comprehensive ATE system that permits other diagnostic techniques, such as guided probing. However, for purposes of this description, "testing" refers to the thermographic imaging process described herein.

Enclosure 11 contains a test fixture 11a, upon which a printed circuit board (PCB) 10 is mounted during testing. Enclosure 11 encloses the test fixture 11a so that the environment around PCB 10 may be controlled. Thus, PCB 10 is protected from air currents that may affect its thermal characteristics and from heat from test personnel or other nearby objects. Also, enclosure 11 provides a means for repeatable alignment of PCB 10 and camera 13. The interior of enclosure 11 is treated to provide a uniform thermal environment. A window 11b in enclosure 11 is thermally transparent so that camera 13 may receive emitted radiation from PCB 10. A door 11c provides access to enclosure 11.

A power supply 11c provides power to PCB 10 during testing. Power supply 11c and other signal sources necessary to provide typical operating conditions for PCB 10 are located outside enclosure 11, and connect to PCB 10 via appropriate electrical connections into enclosure 11.

Infrared source 12 provides infrared illumination of PCB 10 to determine emissivity of components, using a real time emissivity map generation method described below. Other methods for determining emissivity may be used, which may not require infrared source 12.

Infrared camera 13 is part of a conventional thermographic imaging system, which produces electrical signals that may be used to generate a thermographic image showing the infrared radiation from PCB 10. An example of a suitable imaging system is the CCT-9000 manufactured by UTI, which forms a 640×512 pixel image with each pixel represented by 10 bits of data. Camera 13 is positionable to permit viewing of the component side of PCB 10. Proper alignment permits measurement of the thermal features of each component of PCB 10.

Image processing unit 14 receives the output of camera 13 and generates a thermographic images of PCB 10. The primary tasks of image processing unit 14 are to preprocess the image and to generate an emissivity map of PCP 10. As explained below, the emissivity map is used to correct thermal image measurements.

A monitor 17 permits the thermal image to be viewed by test personnel. It also permits the testing to be performed interactively with a test operator, by displaying maps of the PCB 10 and indicating failed components. Also, neural network training is facilitated by interactive input and output via monitor 17 and input means 18, wherein input means is any standard input device such as a keyboard.

In the preferred embodiment, image processing unit 14 preprocesses the image to optimize its informational value and to reduce the volume of data. This preprocessing can include, but is not limited to, image filtering, subtraction with previous images, code compression, or reduction to "device space" records. The latter consist of separate records of the thermal features of each component of PCB 10, and are explained in further detail below in connection with FIG. 2. Image processing unit 14 may be implemented using a conventional computer system programmed to perform the above tasks.

Control unit 15 is a computer system, or dedicated control system, programmed to provide an interactive interface with a test operator. It controls the events that occur during testing and operates in communication with image processing unit 14 and neural network 16. A bus 19 permits data communication between the various units of the test system.

Artificial neural network 16 receives data representing the thermal image, or its reduced form, from image processing unit 14. The configuration of neural network 16 is conventional, consisting of a network of processing elements connected to each other. It may be implemented as a hardware or software neural network, such as specialized processors, dedicated circuitry, and optical processing. The description below is in terms of a conventional computer system programmed to perform neural network operations.

Neural network 16 is trained to match input data representing thermal features of PCB 10 with stored data, such that the output represents a particular fault. A hidden layer of processing elements responds to temperature profiles resulting from failed components, with weights being set during training, as described in further detail below. The output of each processing element is a function of the inputs to the processing element. A typical equation that describes the operation of each processing element is:

$$x_j = g(\text{SUM } w_{ij} x_i)$$

, where $x_i$ and $x_j$ are elements of the vector that includes both network inputs and outputs of the processing elements. The nonlinear function, g, is typically some saturation or limiting function.

Operation of the system of FIG. 1 is based on the assumption that thermal images of similar PCB's are similar and that certain faults cause changes in component dissipation, such that these changes are observable. A number of different kinds of faults can affect the thermal signature of the PCB. In the case of internal device damage, several device technologies, such as CMOS, often present a low impedance across the power supply under failure conditions. Such an unusual draw of power causes the device to become significantly hotter than normal. Other failed devices may open their connections to the power source and run cooler than normal. Outputs stuck and high or low levels may change the heat dissipation pattern of the PCB. In the case of shorted output nodes, if the output of a device drives a low impedance (short) it will dissipate additional power and become hotter. The amount of increased power dissipated will depend on whether the short is to ground, a power supply, or to another output. The effect of the short may be to change the power dissipation of several components as the stuck signal is propagated. A short in a resistance network, such as those around an operational amplifier, will likely change the power dissipation of all the resistors. In the case of a change in an output toggling rate, the power dissipation of much of modern logic is a function of the rate of transition of the outputs. The more often the outputs of a logic device change, the more power it dissipates. Though a particular failed device might not change its temperature significantly, if it affects power dissipation of other devices by inhibiting or provoking their output toggling rates, this effect will be observed. In the case of power supply failure, power source overvoltage and undervoltage can change the power dissipation patterns on the circuit card. The thermal image caused by this problem should point to the power supply. In the case of signal contention, two devices driving the same signal line will cause increased power dissipation in both devices when attempted output levels are different. In the case of impending failures or intermittent failures, sometimes a device becomes erratic and begins to dissipate more heat than normal. As indicated, both devices and their interconnections may affect the temperature profile of the circuit board, and both are referred to herein as "components".

Figure 2:
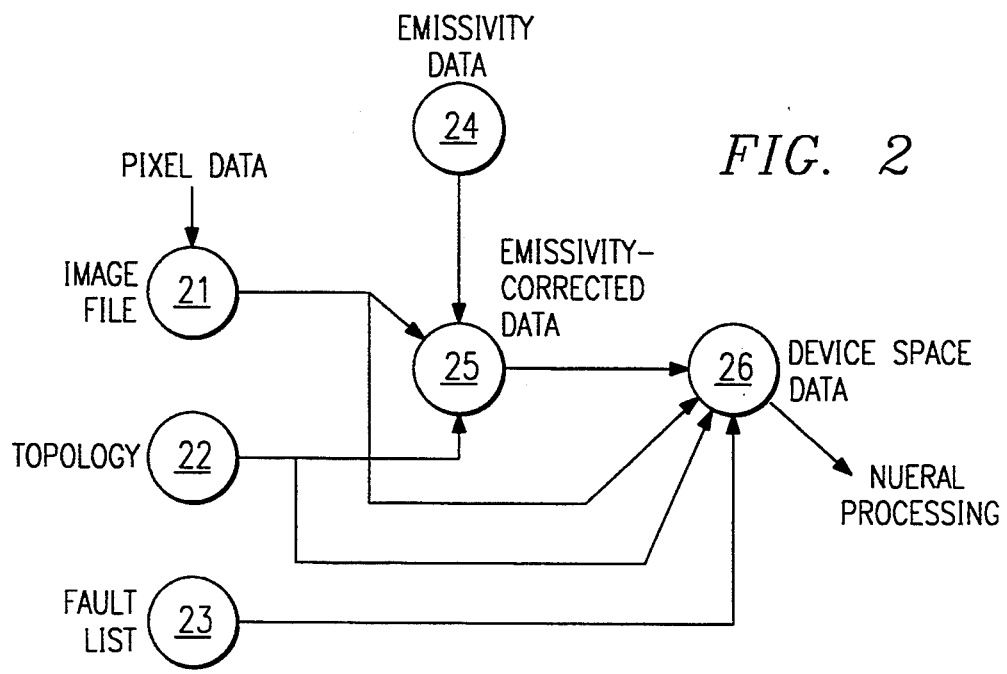
FIG. 2 illustrates flow of data used to prepare data for the neural network of FIG. 1.

FIG. 2 illustrates the data associated with each PCB to be tested. An image file 21 is the data representing the thermographic image of PCB 10. A topology file 22 is data representing the location and dimensions of devices and other physical components of PCB 10. The fault list file 23 is a collection of faults, which is combined with associated thermographic data for use in training neural network 16.

As indicated in FIG. 2, the image file is corrected with emissivity data 24 to obtain a corrected image data file 25. This step is based on the premise that emissivity data of PCB 10 must be obtained before a "true" thermal image of its components can be acquired. This emissivity data represents variations in emissivity over PCB 10 and its components. Without correction for emissivity data, the temperature measurements would result in components such as a metal cap, appearing cooler than an equivalent ceramic package.

The obtaining of emissivity data from PCB 10 may be accomplished using various known techniques. One known method for determining an emissivity map for complex objects such as a PCB is to measure the radiated energy of the object at two known temperatures. However, one aspect of the invention is an improved method of obtaining an emissivity map. In general, this method is based on the equivalence of emissivity and absorption coefficients and involves processing both absorbed and reflected radiation. Radiant energy striking an object is either absorbed, reflected, or transmitted. This relationship can be expressed in terms of the energy at any point, (x,y), on the image as:

$$E_I(x,y) = E_R(x,y) + E_A(x,y) + E_T(x,y)$$

, where $E_I$, $E_R$, $E_A$, and $E_T$ represented energy that is incident, reflected, absorbed, and transmitted, respectively. The assumption is made that PCB 10 is opaque, thus the last term of the above equation is 0, such that:

$$E_I(x,y) = E_R(x,y) + E_A(x,y)$$

. The above equation can be normalized by the incident energy to obtain a relationship between the absorption and reflection coefficients at any point:

$$1 = p(x,y) + \alpha(x,y)$$

, where the reflection coefficient, p, is:

$$p(x,y) = \frac{E_R(x,y)}{E_I(x,y)}$$

and the absorption coefficient, $\alpha$, is:

$$\alpha(x,y) = \frac{E_A(x,y)}{E_I(x,y)}$$

Because the absorption value is equal to the emissivity value, the above equation may be rewritten in terms of emissivity, $\epsilon$, as:

$$1 = p(x,y) + \epsilon(x,y)$$

To obtain an emissivity map, a point of high reflectance, $(x_o, Y_o)$, on PCB 10 is identified. This point can be either a bare metal surface on PCB 10, or a small reflective target attached to PCB 10. If PCB 10 is uniformly illuminated with infrared radiation of the same spectral range as used to obtain temperature measurements, the measured energy at point $(x_o, y_o)$ is approximately:

$$E_R(x_o, y_o) = p(x_o, y_o) + E_I(x_o, y_o)$$
$$= (1 - \epsilon(x_o, y_o)) * E_I(x_o, y_o)$$

. For highly reflective surfaces, $E_R = E_I$.

Because of the uniform light source, the energy density is assumed to be uniform over the entire surface of PCB 10. The incident energy density can be assumed to be approximately equal to the measured peak energy density at any point on PCB when it is illuminated. Using this peak value of reflected energy, the emissivity at any point of PCB 10 can be obtained from:

$$\epsilon(x,y) = 1 - \alpha(x, y)$$
$$= 1 - \frac{E_{R(measured)}(x, y)}{E_I}$$
$$approx = 1 - \frac{E_{R(measured)}(x,y)}{E_{R\,peak\,(measured)}}$$

The preceding equation represents the emissivity map for PCB 10 in the absence of any additional contributions to the measured energy. However, the measured energy from PCB 10 includes both reflected energy and radiated energy. Thus, the measured energy from PCB 10 is:

$$E_{measured}(x,y) = E_{IR\,source\,reflection}(x,y) + E_{environment\,reflection}(x,y) + E_{radiated}(x,y)$$

. For an object at thermal equilibrium with its environment, the last two terms of the above equation form an image that is a function of the environment. These two terms together form a basis thermal energy map of PCB 10, or:

$$C(x,y) = E_{environment}(x,y) + E_{radiated}(x,y)$$

, and $$E_{measured}(x,y) = E_{IR\,source\,reflection}(x,y) + C(x,y)$$

. The emissivity map is obtained from measurement, using the following equation:

$$\epsilon(x,y) = 1 - \frac{E_{measured}(x,y) - C(x,y)}{MAX[E_{measured}(x,y) - C(x,y)]} \quad (1)$$

A more general variation of the preceding equation for $\epsilon$ can be used to obtain the emissivity map where an object of known emissivity is on PCB 10. The requirement of an object of high reflectance in the image is relaxed. The equation is:

$$\epsilon(x,y) = 1 - (1 - \epsilon(x_k, y_k)) * \frac{E_{measured}(x,y) - C(x,y)}{E_{measured}(x_k, y_k) - C(x_k, y_k)} \quad (2)$$

Consistent with the above theoretical discussion, a method for using the system of FIG. 1 to obtain an emissivity map is performed as follows. As a first step, PCB 10 is placed in enclosure 11, such that extraneous reflection and convection air currents are minimized. PCB 10 is not powered during this step, and is at thermal equilibrium with the environment. An image, $C(x,y)$, is captured by infrared camera 13. This image contains all contributions of the environment surrounding PCB 10.

Next, PCB 10 is briefly illuminated with a uniform, low level radiation from infrared source 12 and is viewed by camera 13. The infrared illumination provides considerably more energy than is radiated by PCB 10 under power. The illumination interval is short, and no significant heating of the object occurs. The result is a second image, $I(x,y)$.

Next, the difference image, $R(x,y)$, between $I(x,y)$ and $C(x,y)$ is calculated, using any processing unit, such as image processing unit 14. In a first variation of the method for determining emissivity, the next two steps are obtaining an emissivity map by finding the maximum value of $R(x,y)$, and applying equation (1) above. In a second variation of the method, the next two steps are finding the value of $R(x,y)$ at a known point, and applying equation (2) above.

Once the emissivity map is acquired, the actual test sequence is performed. Power is applied to PCB 10 and appropriate electrical stimulus is applied. At least one thermal image is obtained. In the preferred embodiment, several images are obtained at different intervals during warm-up, which avoids the effect of temperature "smearing" as the temperature stabilizes. The infrared energy emitted by PCB 10 is captured by camera 13 and converted to digital form by image processing unit 14. The result is an image data file, as indicated in FIG. 2.

The image file is then corrected for variation in thermal emissivity. The emissivity map is combined with the thermal image data to produce an emissivity corrected data file. The equation for the correction is:

$$E_{blackbody}(x,y) = \frac{E_{measured\ radiation}(x,y)}{\epsilon(x,y)}$$

. The temperature profile of PCB 10 can be obtained from $E_{blackbody}$.

The image data file 25 contains a large volume of information. As explained above, to avoid working with this large volume, image processing unit 14 preprocesses the image data to compact the information. One means for compacting the data is to convert "pixel space" to "device space". Every significant region of PCB 10 is uniquely identified by the device that resides there. Each device is considered a coordinate in "device space". The distance along each coordinate is a measure of a thermal feature of the associated device. The thermal feature of a device may be peak temperature, temperature integrated over an area, peak gradient, or some other temperature-related measure. Ideally, the thermal feature that provides the greatest discrimination of faults is selected. PCB 10 may then be described by a list of devices and the values of the thermal feature of each. The compacted thermal information of PCB 10 represented in the "device space" permits the use of a relatively small neural network 16.

Referring again to FIG. 2, a physical map, or topology data file 22, is used to obtain device space data file 26 from the thermal image. Once device space data file 26 is obtained, the thermal feature data is presented to neural network 16, which has been previously trained with examples of possible faults that may occur in PCB 10. Each component of PCB 10 is associated with an output of neural network 16. The output value indicates whether the associated component has a fault. A number of tests may be performed with different data sets to test for different types of faults.

The use of neural network 16 to develop diagnostic relationships and rules for associating thermal features with faults is an alternative to the more traditional development of rules using empirical methods. In the latter approach, relationships and rules are manually derived from the data, and require someone experienced in observing and stating significant relationships.

The capability of a neural network such as neural network 16, to learn complex relationships by example, may be used to relate thermal patterns to device faults. An initial training period for each type of PCB to be tested is needed, in which neural network 16 is trained using a training set of thermal features and known faults. The training set is developed by using PCB's with known faults. To create the training set, the thermal image of each faulted PCB is acquired and converted to device space data. This data is matched to fault data. Thus, the training set consists of thermal signatures of each faulted PCB, along with the fault associated with that signature.

A technique known as backpropagation is used for training neural network 16. In this algorithm, examples of thermal patterns and associated known faults are presented to the neural network 16. The network produces an output that is a function of the information stored in the network weights and the input. The error between the actual output (predicted fault) and the desired output (known fault) is back propagated through neural network 16 to correct the weights and reduce the error. Training is halted when the error has been reduced to an acceptable level. Other known training algorithms may be used.

Appendix A sets out the programming for an artificial neural network in accordance with the invention. It is written in the C programming language, but any other suitable language may be used. This programming is executed by a computer that is part of neural network 16, or as stated above, may be executed on a multi-purpose computer that also performs the tasks of image processing unit 14 or control unit 15 or both.

As shown in Appendix A, a number of data structures are declared for the neural net variables. The Input_Data structure contains the temperature features of the PCB being operated on, which may be a PCB 10 under test or a PCB with a known faults being used for training purposes. The Physical_Map structure contains the topology of the PCB 10 under test, The Data_Set structure contains a stored collection of data sets of faults associated with thermographic data.

A main routine calls various initialization and input-/output subroutines, as well as a subroutine for neural network operation. More specifically, the Initialize subroutine reads a map file by calling a subroutine Read_Map_File, defines the hidden layer, and prints a display screen. A Pause_Options subroutine displays commands available in a "pause" mode, specifically, LoadData, Step, DumpWts, and LoadWts commands, which result in loading a data file, stepping to a next data set, and saving weight values, respectively.

The Initialize_Wts subroutine initializes weights and biases for the neural network. The Display_Screen subroutine generates a display of the neural network and output decisions. The Update_Display subroutine generates a display of the physical map of PCB 10. The subroutine Mode Line displays commands choices that exist in all modes, such as "quit", "train" and "pause/-run". These and other commands are handled by the Keyboard_Command subroutine, which tests for key depressions and takes appropriate action. Additional command include a command for reading a data file to load temperature data, Read_Data_File, a command for loading weight values, Read_Wts_File, and a command for saving weight values, Write_Wts_File.

The run time operation of the programming has three modes, as indicated by the Status_Line subroutine. The status may be "mean squared error", "iterations", or "set number". The mean square error mode indicates the error resulting when the neural network output is compared to an expected output. This mode is useful during training. The iterations mode is also used during training and permits weights to be adjusted to reduce the error to a desired value. Once a desired set of weights is determined, the subroutine Write_Wts_File is used to save it. The set number mode indicates the present data set being tested.

During neural network operation, the subroutine Get_Next_Data_Set is called to fetch the next input-/output data set from a stored collection of data sets. The Update_Network subroutine has two options. A first option performs forward processing to indicate a failed component from a previously trained network. A second option permits weights to be adjusted for training purposes.

Other Embodiments

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

APPENDIX A

```
/* includes                                                          */
#include <stdio.h>
#include <math.h>
#include <hlev.h>
#include <dos.h>
#include <graph.h>

/* definitions                                                       */
#define Display_Width           190
#define Display_Height          150
#define Hidden_Display_Width     50
#define Hidden_Display_Height   240
#define Max_Components           50
#define Max_Hidden               40
#define Max_Sets                 40
#define Ellipse_parts            16
#define deltaA                   2.0 * 3.14159/Ellipse_parts
define color_scale             14.0      /* no whites allowed */ define momentum                 .9
define Pause_Line_Pos          310
#define Status_Line_Pos         280
#define Mode_Line_Pos           295
define Banner_Line_Pos           0 define Input_DisplayX0           0
define Input_DisplayY0         Banner_Line_Pos + 30
#define Output_DisplayX0        400
#define Output_DisplayY0        Banner_Line_Pos + 30
#define Hidden_DisplayX0        275
define Hidden_DisplayY0        Banner_Line_Pos + 30 define TRUE                      1
```

```
define FALSE            0 int     quit_flag = FALSE,
        test_flag = FALSE,
        train_flag = FALSE,
        data_flag = FALSE,
        map_flag = FALSE,
        pause_flag = TRUE;
        ActualOut_flag = TRUE;
        height,                 /* of input card */
        width,                  /* of input card */
        number_of_components,   /* on input card */
        number_of_hidden,       /* number of hidden elements */
        DeltaH,                 /* Display interval for hidden units */
        Sets,                   /* number of data sets in the data file */
        Set_Index;              /* index to present data set */ long    Iterations;             /* number of cycles accomplished */ float   MSerror;                /* Mean Square Error */
float   MaxOutputLevel;         /* Maximum Desired Output Level */
float   MaxInputLevel;
float   learn_rate = .20;
float   xscale, yscale;         /* maps card size and available space */
float   ellipsex[Ellipse_parts],
        ellipsey[Ellipse_parts]; /* coordinate parts of an ellipse */

/* structures needed for neural net variables */ int     Physical_Map[Max_Components][5];   /* type, xcenter,ycenter,xdimension,
                                              xdimension */ float   Input_Data[Max_Components][2];     /* input temp, feature,
                                              device good/bad */ float   Data_Set[Max_Components][2 * Max_Sets]; /* a collection of data */
                                                /* sets */ float   Hidden_Wts[Max_Components][Max_Hidden]; /* connections from input */
                                                /* layer to hidden layer */
float   DeltaHWts[Max_Components][Max_Hidden];  /* old delta */ float   Output_Wts[Max_Hidden][Max_Components]; /* connections from hidden */
                                                /* layer to output layer */
float   DeltaOWts[Max_Hidden][Max_Components];  /* old delta */ float   Hidden_Output[Max_Hidden];              /* the outputs of the hidden */
                                                /* layer */
float   BiasH[Max_Hidden];                      /* bias level to PEH */ float   DeltaHBias[Max_Hidden];

float   Hidden_Error[Max_Hidden];               /* Output error associated */
                                                /* the hidden layer */ float   Output_Output[Max_Components];          /* the outputs of the output */
                                                /* layer */
float   BiasO[Max_Components];                  /* the level of bias to PEO */ float   DeltaOBias[Max_Components];

float   Output_Error[Max_Components];           /* error associated with */
                                                /* the network output */ char    Data_File[25],Map_File[25],Wts_File[25]; /* strings for filenames */

/**********************************************************************/
/**********************************************************************/
```

```
/****************************************************************/
/*                                                              */
/*                                                              */
/*    MAIN ROUTINE                                              */
/*                                                              */
/*                                                              */
/*                                                              */
/****************************************************************/
/****************************************************************/
/****************************************************************/
main()
     {
     Initialize();
     Initialize_Wts();
     Display_Screen();
     Update_Display();
     Mode_Line();
     while(!quit_flag){
          Keyboard_Command();
          if((pause_flag == FALSE) && (data_flag == TRUE)){
            Get_Next_Data_Set();
            Update_Network();
            if(test_flag == FALSE){
               Update_Display();
               }
            Status_Line();
            }
          }
     Termination_action();
     }

/****************************************************************/
/* Initialize()                                                 */
/* This subroutine is to setup the initial conditions for the program. */
/*                                                              */
/*                                                              */
/*                                                              */
/*                                                              */
/*                                                              */
/*                                                              */
/****************************************************************/
Initialize()
     {
     int i, j;
     char txt[20];

Iterations = 0;

init(1);      /* set screen mode to EGA graphics, 2 screens   */

/* Don't do anything until we get a map                         */ while(map_flag == FALSE){
       Read_Map_File();
       }

/* Don't do anything until we get a definition of hidden layer  */
     while((number_of_hidden <= 0) || (number_of_hidden >= Max_Hidden)){
          goto_xy(0,23);
          printf(" Enter desired number of Hidden Elements        ");
          goto_xy(42,23);
          scanf("%d",&number_of_hidden);
          setcur(HIDE,42,23);
          }

/* clear line */
```

```
            goto_xy(0,23);
            printf("                                                ");

/* Print Pretty Screen      */ moveab(50,Banner_Line_Pos);          /* Display BANNER */
            dcolor(LIGHT_BLUE);
            text("PCB DIAGNOSTICS USING NEURAL NETWORKS AND THERMOGRAPHY");
            dcolor(WHITE);

/* set initial modes         */
            pause_flag = TRUE;
            Pause_Options();

moveab(0,Status_Line_Pos);           /* Display "Paused" Mode */
            dcolor(LIGHT_BLUE);
            text("PAUSING");

moveab(100,Status_Line_Pos);         /* Display Training Status  */
            text("TRAINING");
            moveab(170,Status_Line_Pos);
            dcolor(DARK_RED);
            text("OFF");

moveab(300,Status_Line_Pos);         /* Display "MEAN SQUARED ERROR" */
            dcolor(LIGHT_BLUE);
            text("MEAN SQUARE ERROR  ");
            sprintf(txt,"%f",MSerror);
            dcolor(LIGHT_GREEN);
            text(txt);

dcolor(LIGHT_BLUE);                  /* Display "ITERATIONS"      */
            moveab(500,Status_Line_Pos);
            text("ITERATIONS  ");
            dcolor(LIGHT_GREEN);
            sprintf(txt,"%d",Iterations);
            text(txt);

moveab(300,Status_Line_Pos+15);      /* Display "RATE" */
            dcolor(LIGHT_BLUE);
            text("RATE  ");
            sprintf(txt,"%f",learn_rate);
            dcolor(LIGHT_GREEN);
            text(txt);

/*          create the constants for ellipse generation                               */
            for (i=1;i<=Ellipse_parts;i++){
              ellipsex[i] = sin((float)i * deltaA);
              ellipsey[i] = cos((float)i * deltaA);
            }
}

/*******************************************************************/
/*   Initialize_Wts() and Biases                                    */
/*                                                                  */
/*                                                                  */
/*******************************************************************/
Initialize_Wts()
{
            float tempv;
            int i, j, tggl;
            Iterations = 0;
            dcolor(LIGHT_BLUE);                  /* Display "ITERATIONS"      */
```

```
        moveab(500,Status_Line_Pos);
        text("ITERATIONS        ");
/*   Initialize the weights                                              */
        tggl = -1;
        tempv = (float)(number_of_components * number_of_hidden);
        for(i=1;i<=number_of_components;i++){
          for(j=1;j<=number_of_hidden;j++){
            tggl = -tggl;
            Hidden_Wts[i][j] = 0.1 * ((float)(tggl * i * j))/tempv;
            Output_Wts[j][i] = 0.1 * ((float)(tggl * i * j))/tempv;
            }
          }
/*   Initialize the biases                                               */ for(i=1;i<=number_of_components;i++){
          Bias0[i] = -1.5;
          } for(j=1;j<=number_of_hidden;j++){
          BiasH[j] = -1.5;
          }

}

/**********************************************************************/
/* Keyboard_Command()                                                  */
/*                                                                     */
/* This subroutine tests for key depressions and, if they occur, takes */
/*   appropriate action.                                               */
/*                                                                     */
/*                                                                     */
/*                                                                     */
/*                                                                     */
/**********************************************************************/
Keyboard_command()
        {
        char txt[20];
        char chr;
        while(kbhit()){
                chr = toupper(getch());
                switch(chr) {
                        case 'A':    /* toggle between actual and desired */
                                if(ActualOut_flag){
                                  ActualOut_flag = FALSE;
                                  moveab(Output_DisplayX0,Output_DisplayY0 - 15);
                                  dcolor(WHITE);
                                  text("Desired Outputs ");
                                  }
                                else{
                                  ActualOut_flag = TRUE;
                                  moveab(Output_DisplayX0,Output_DisplayY0 - 15);
                                  dcolor(WHITE);
                                  text("Output Decisions");
                                  }
                                Update_Display();
                                break;
                        case 'D':    /*    Load Data File   */
                                if(pause_flag){
                                Read_Data_File();
                                }
                                break;
                        case 'I':    /* initialize */
                                Initialize_Wts();
                                break;
                        case 'L':    /* Load Weights   */
                                if(pause_flag){
                                  Read_Wts_File();
                                  }
```

```
                break;
        case 'P':{
                if(pause_flag == FALSE){
                        pause_flag = TRUE;
                        moveab(0,Status_Line_Pos);
                        dcolor(LIGHT_BLUE);
                        text("PAUSING");
                        Pause_Options();
                        }
                else{
                        pause_flag = FALSE;
                        moveab(0,Status_Line_Pos);
                        dcolor(LIGHT_BLUE);
                        text("RUNNING");
                        moveab(0,Pause_Line_Pos);
                        text("                                                                    ");
                        }
                }
                break;

case 'Q':       /*      quit    */
                quit_flag = TRUE;
                break;
        case 'S':       /* Step Once    */
                if(pause_flag && data_flag){
                        Get_Next_Data_Set();
                        Update_Network();
                        Update_Display();
                        Status_Line();
                }
                break;

case 'T':{      /*      Toggle Training Flag    */
                if(train_flag){
                        train_flag = FALSE;
                        moveab(170,Status_Line_Pos);
                        dcolor(DARK_RED);
                        text("OFF");
                        }
                else{
                        train_flag = TRUE;
                        moveab(170,Status_Line_Pos);
                        dcolor(DARK_RED);
                        text("ON ");
                        }
                }
                break;

case 'W':       /* Save Weights */
                if(pause_flag){
                        Write_Wts_File();
                }
                break;
        case 'Z':       /* Test modes enable */
                if(test_flag){
                        test_flag = FALSE;
                        }
                else{
                        test_flag = TRUE;
                        }
                break;
        case '>':       /* increment training gain */
                learn_rate = learn_rate + 0.02;
moveab(300,Status_Line_Pos+15);     /* Display "RATE" */
dcolor(LIGHT_BLUE);
```

```
            text("RATE ");
            sprintf(txt,"%f",learn_rate);
            dcolor(LIGHT_GREEN);
            text(txt);

break;
                case '<':        /* decrement training gain */
                        learn_rate = learn_rate - 0.02;

moveab(300,Status_Line_Pos+15);   /* Display "RATE" */
            dcolor(LIGHT_BLUE);
            text("RATE ");
            sprintf(txt,"%f",learn_rate);
            dcolor(LIGHT_GREEN);
            text(txt);

break;
                default:
                        break;
                }
        }

}

/****************************************************************/
/* Display_Screen()                                             */
/*                                                              */
/*                                                              */
/*                                                              */
/*                                                              */
/*                                                              */
/*                                                              */
/*                                                              */
/****************************************************************/
Display_Screen(){
        int i, dheight;
        dcolor(WHITE);
        dheight = (int)((float)height * yscale);

/*      DISPLAY INPUT AREA                                      */
        rectab(Input_DisplayX0,Input_DisplayY0,
               Input_DisplayX0+Display_Width,
               Input_DisplayY0+dheight,0);

/*      DISPLAY OUTPUT AREA                                     */
        rectab(Output_DisplayX0,Output_DisplayY0,
               Output_DisplayX0+Display_Width,
               Output_DisplayY0+dheight,0);

/*      DISPLAY HIDDEN AREA                                     */
        DeltaH = (int)((float)Hidden_Display_Height/(float)number_of_hidden);
        for(i=1;i<=number_of_hidden;i++){
            rectab(Hidden_DisplayX0,Hidden_DisplayY0 + (i-1) * DeltaH + 2,
               Hidden_DisplayX0+Hidden_Display_Width,
               Hidden_DisplayY0+ i * DeltaH,0);
        } moveab(Input_DisplayX0,Input_DisplayY0 - 15);
        text("Input Data");
        Moveab(Hidden_DisplayX0,Hidden_DisplayY0 - 15);
        text("Hidden Layer");
        moveab(Output_DisplayX0,Output_DisplayY0 - 15);
```

```
        text("Output Decisions");
        }

/**************************************************************/
/* Update_Display()                                           */
/*                                                            */
/*                                                            */
/*                                                            */
/*                                                            */
/*                                                            */
/*                                                            */
/*                                                            */
/**************************************************************/
Update_Display(){
    int i, tempx, tempy, xcent, ycent, deltax, deltay;
    if(data_flag){
      for(i = 1;i<=number_of_components;i++){

/*    Color Input Space          */
        dcolor((int)(color_scale * Input_Data[i][1]));
        flood(Physical_Map[i][2]+Input_DisplayX0,
              Physical_Map[i][3]+Input_DisplayY0);

/*    Color Output Space         */
        if(ActualOut_flag){
                dcolor((int)(color_scale * Output_Output[i]));
                }
                else{
                dcolor((int)(color_scale * Input_Data[i][2]));
                }
        flood(Physical_Map[i][2]+Output_DisplayX0,
              Physical_Map[i][3]+Output_DisplayY0);
        } for(i=1;i<=number_of_hidden;i++){
        dcolor((int)(color_scale * Hidden_Output[i]));
        flood(Hidden_DisplayX0 + Hidden_Display_Width/2,
            Hidden_DisplayY0 + DeltaH/2 + (i-1)*DeltaH);
        }

} if(map_flag){
      dcolor(WHITE);
      for(i = 1;i<=number_of_components;i++){
        if(Physical_Map[i][1] == 0) {
           deltax = Physical_Map[i][4];
           deltay = Physical_Map[i][5];
           tempx = Physical_Map[i][2] - deltax/2;
           tempy = Physical_Map[i][3] - deltay/2;
           rectab(tempx + Input_DisplayX0,
                  tempy + Input_DisplayY0,
                  tempx + deltax + Input_DisplayX0,
                  tempy + deltay + Input_DisplayY0,0);
           rectab(tempx + Output_DisplayX0,
                  tempy + Output_DisplayY0,
                  tempx + deltax + Output_DisplayX0,
                  tempy + deltay + Output_DisplayY0,0);

}
        if(Physical_Map[i][1] == 4) {
           deltax = Physical_Map[i][4];
           deltay = Physical_Map[i][5];
```

```
                xcent = Physical_Map[i][2];
                ycent = Physical_Map[i][3];
                tempx = xcent - deltax/2;
                tempy = ycent - deltay/2;
                moveab(Input_DisplayX0 + tempx,
                       Input_DisplayY0 + ycent);      /* xc-dx/2,yc */ drawab(Input_DisplayX0 + xcent,
                       Input_DisplayY0 + tempy);      /* xc,yc-dy/2 */
                moveab(Input_DisplayX0 + xcent,
                       Input_DisplayY0 + tempy);      /* xc,yc-dy/2 */ drawab(Input_DisplayX0 + tempx + deltax,
                       Input_DisplayY0 + ycent);      /* xc+dx/2,yc */
                moveab(Input_DisplayX0 + tempx + deltax,
                       Input_DisplayY0 + ycent);      /* xc+dx/2,yc */ drawab(Input_DisplayX0 + xcent,
                       Input_DisplayY0 + tempy + deltay);  /* xc,yc+dy/2 */
                moveab(Input_DisplayX0 + xcent,
                       Input_DisplayY0 + tempy + deltay);  /* xc,yc+dy/2 */ drawab(Input_DisplayX0 + tempx,
                       Input_DisplayY0 + ycent);      /* xc-dx/2,yc */ moveab(Output_DisplayX0 + tempx,
                       Output_DisplayY0 + ycent);

drawab(Output_DisplayX0 + xcent,
                       Output_DisplayY0 + tempy);
                moveab(Output_DisplayX0 + xcent,
                       Output_DisplayY0 + tempy);

drawab(Output_DisplayX0 + tempx + deltax,
                       Output_DisplayY0 + ycent);
                moveab(Output_DisplayX0 + tempx + deltax,
                       Output_DisplayY0 + ycent);

drawab(Output_DisplayX0 + xcent,
                       Output_DisplayY0 + tempy + deltay);
                moveab(Output_DisplayX0 + xcent,
                       Output_DisplayY0 + tempy + deltay);

drawab(Output_DisplayX0 + tempx,
                       Output_DisplayY0 + ycent);

/*****************************************   *****************************  ********/
/*  Get_Next_Data_Set()                                                            */
/*   This subroutine fetches the next input/output set from the                    */
/*    stored collection of data sets.  It starts again at the first if             */
/*    the end is reached.                                                          */
/*                                                                                 */
/*                                                                                 */
/*                                                                                 */
/*                                                                                 */
/***********************************************************************************/
Get_Next_Data_Set()
    {
    int i;
    Set_Index = Set_Index + 1;
    if(Set_Index > Sets){
        Set_Index = 1;
        }
    for(i=1;i<=number_of_components;i++){
        Input_Data[i][1] = Data_Set[i][2 * Set_Index - 1];
```

```
            Input_Data[i][2] = Data_Set[i][2 * Set_Index];
         }
      }
```

```
/*********************************************************/
/* goto_xy(x,y)                                          */
/* This is a routine to move the cursor to x,y           */
/*                                                       */
/*                                                       */
/*                                                       */
/*                                                       */
/*                                                       */
/*                                                       */
/*********************************************************/
goto_xy(x,y)
int x,y;
   {
      union REGS r;
      r.h.ah=2;       /* cursor addressing function  */
      r.h.dl=x;       /* column coordinate           */
      r.h.dh=y;       /* row coordinate              */
      r.h.bh=0;       /* video page                  */
      int86(0x10, &r, &r);
   }
```

```
/*********************************************************/
/* Read_Data_File()                                      */
/* This subroutine is to bring in the data records for training and */
/*    testing the network                                */
/*                                                       */
/*                                                       */
/*                                                       */
/*                                                       */
/*                                                       */
/*********************************************************/
Read_Data_File(){
      int i, j, components, InputData, OutputData;
      FILE  *filepointer;
      if (map_flag == TRUE) {
        goto_xy(0,23);
        printf("Enter name of data file  ");
        scanf("%24s",Data_File);
        data_flag = TRUE;
        if ((filepointer = fopen(Data_File,"r")) == NULL){
          data_flag = FALSE;
          goto_xy(0,23);
          printf(" *** Data file could not be opened \n");
        }
```

```
/*    If the data file is found, read in the number of components and
      the number of records in the data set. If the number of components
      agrees with the number read in from the "map" file, then read in
      the data.  The data is converted to floating point and normalized
      to be between "0.0" and "1.0".
*/ if (data_flag == TRUE){
          goto_xy(0,23);
          printf("                                                                         ");
          fscanf(filepointer, "%d %d", &components, &Sets);
          MaxInputLevel = 0.0;
          MaxOutputLevel = 0.0;if (components == number_of_components){
```

```
                    for(j=1;j<=Sets;j++){
                      for(i=1;i<=number_of_components;i++){
                        fscanf(filepointer,"%d %d", &InputData, &OutputData);
                        Data_Set[i][2*j-1] = (float)InputData;
                        if(Data_Set[i][2*j-1] > MaxInputLevel){
                            MaxInputLevel = Data_Set[i][2*j-1];
                        }
                        Data_Set[i][2*j] = (float)OutputData;
                        if(Data_Set[i][2*j] > MaxOutputLevel){
                            MaxOutputLevel = Data_Set[i][2*j];
                        }
                      }
                    }

/*          NORMALIZE INPUT AND OUTPUT DATA TO A MAX VALUE OF "1.0"           */
                    for(j=1;j<=Sets;j++){
                      for(i=1;i<=number_of_components;i++){
                        Data_Set[i][2*j-1] = Data_Set[i][2*j-1]/MaxInputLevel;
                        Data_Set[i][2*j]   = Data_Set[i][2*j]/MaxOutputLevel;
                      }
                    }

}
                else {
                   goto_xy(0,23);
                   printf(" **** component number mismatch *** \n");
                }
                fclose(filepointer);
            }
        }
        else {
           data_flag = FALSE;
           goto_xy(0,23);
           printf(" Card Map needs to be specified first  \n");
        }
}

/****************************************************************************/
/* Read_Map_File()                                                          */
/*- This subroutine is to bring in the physical discription of the          */
/*   circuit card.                                                          */
/*                                                                          */
/* File Records are;                                                        */
/*  [Card Width]   [Card Length]   [Number of Components]                   */
/*  [comp 1 Type] [comp 1 Xc] [comp 1 Yc] [comp 1 Dx] [comp 1 Dy]           */
/*  [comp 2 Type] [comp 2 Xc] [comp 2 Yc] [comp 2 Dx] [comp 2 Dy]           */
/*                       etc.                                               */
/****************************************************************************/
Read_Map_File(){
        FILE   *filepointer;
        int i /* dh=Display_Height/10,dw=Display_Width/10 */;

map_flag = TRUE;
        goto_xy(0,23);
        printf("Enter name of Printed Circuit Card file  ");
        scanf("%24s",Map_File);

if ((filepointer = fopen(Map_File,"r")) == NULL){
          map_flag = FALSE;
          goto_xy(0,23);
          printf(" *** PCB file could not be opened \n");
        } if (map_flag == TRUE){
```

```
        goto_xy(0,23);      /* remove screen text to indicate in progress */
        printf("                                                          ");

fscanf(filepointer,"%d %d %d",&width,&height,&number_of_components);

for(i=1;i<=number_of_components;i++){
           fscanf(filepointer,"%d %d %d %d %d", &Physical_Map[i][1],
             &Physical_Map[i][2],&Physical_Map[i][3],&Physical_Map[i][4],
             &Physical_Map[i][5]);

/*      Scale Data to fit the available screen space                      */
        xscale = (float)Display_Width / (float)width;
        yscale = 0.75 * xscale;
        Physical_Map[i][2] = (int)((float)Physical_Map[i][2] * xscale);
        Physical_Map[i][3] = (int)((float)Physical_Map[i][3] * yscale);
        Physical_Map[i][4] = (int)((float)Physical_Map[i][4] * xscale);
        Physical_Map[i][5] = (int)((float)Physical_Map[i][5] * yscale);

}
        fclose(filepointer);
        }
}

/***********************************************************************/
/* Read_Wts_File()                                                     */
/* This subroutine is to bring in the Network Weights file of the      */
/*    circuit card.                                                    */
/*                                                                     */

}

/***********************************************************************/
/* Read_Map_File()                                                     */
/* This subroutine is to bring in the physical discription of the      */
/*    circuit card.                                                    */
/*                                                                     */
/*    File Records are;                                                */
/*    [Card Width]   [Card Length]   [Number of Components]            */
/*    [comp 1 Type] [comp 1 Xc] [comp 1 Yc] [comp 1 Dx] [comp 1 Dy]   */
/*    [comp 2 Type] [comp 2 Xc] [comp 2 Yc] [comp 2 Dx] [comp 2 Dy]   */
/*                      etc.                                           */
/***********************************************************************/
Read_Map_File(){
        FILE    *filepointer;
        int i  /* dh=Display_Height/10,dw=Display_Width/10 */;

map_flag = TRUE;
        goto_xy(0,23);
        printf("Enter name of Printed Circuit Card file ");
        scanf("%24s",Map_File);

if ((filepointer = fopen(Map_File,"r")) == NULL){
          map_flag = FALSE;
          goto_xy(0,23);
          printf(" *** PCB file could not be opened \n");
        } if (map_flag == TRUE){ goto_xy(0,23);      /* remove screen text to indicate in progress */
           printf("                                                          ");

fscanf(filepointer,"%d %d %d",&width,&height,&number_of_components);

for(i=1;i<=number_of_components;i++){
              fscanf(filepointer,"%d %d %d %d %d", &Physical_Map[i][1],
```

```
                    &Physical_Map[i][2],&Physical_Map[i][3],&Physical_Map[i][4],
                    &Physical_Map[i][5]);

/*      Scale Data to fit the available screen space                         */
            xscale = (float)Display_Width / (float)width;
            yscale = 0.75 * xscale;
            Physical_Map[i][2] = (int)((float)Physical_Map[i][2] * xscale);
            Physical_Map[i][3] = (int)((float)Physical_Map[i][3] * yscale);
            Physical_Map[i][4] = (int)((float)Physical_Map[i][4] * xscale);
            Physical_Map[i][5] = (int)((float)Physical_Map[i][5] * yscale);

}
        fclose(filepointer);
        }
}

/***********************************************************************/
/* Read_Wts_File()                                                     */
/* This subroutine is to bring in the Network Weights file of the      */
/*     circuit card.                                                   */
/*                                                                     */
/* must include PCB identifier  and network structure identification   */
/*                                                                     */
/*                                                                     */
/*                                                                     */
/***********************************************************************/
Read_Wts_File(){
        int i,j;
        FILE    *filepointer;
        goto_xy(0,23);
        printf("Enter name of Weights file:  ");
        scanf("%24s",Wts_File);
        if ((filepointer = fopen(Wts_File,"r")) == NULL){
                goto_xy(0,23);
                printf(" *** WTS file could not be opened   ");
                }
        else{
        fscanf(filepointer,"%d %d",&number_of_components,&number_of_hidden);
        /* load input to hidden weights  */
        for(i=1;i<=number_of_hidden;i++){
          for(j=1;j<=number_of_components;j++){
            fscanf(filepointer,"%f",&Hidden_Wts[j][i]);
            }
          fscanf(filepointer,"%f",&BiasH[i]);
          }

/* load hidden to output weights */
        for(i=1;i<=number_of_components;i++){
          for(j=1;j<=number_of_hidden;j++){
            fscanf(filepointer,"%f",&Output_Wts[j][i]);
            }
          fscanf(filepointer,"%f",&BiasO[i]);
          }
        fclose(filepointer);
        }
    }

/***********************************************************************/
/* Write_Wts_File()                                                    */
/* This subroutine is to save the Network Weights file of the          */
/*     circuit card.                                                   */
/*                                                                     */
/* must include PCB identifier, and network structure identification   */
/*                                                                     */
```

```
/*   (number of inputs, number of hidden)                                    */
/*                                                                           */
/*****************************************************************************/
Write_Wts_File(){
        int i,j;
        FILE    *filepointer;
        goto_xy(0,23);
        printf("Enter name of Weights file: ");
        scanf("%24s",Wts_File);
        goto_xy(0,23);
        printf("                                                           ");
        if ((filepointer = fopen(Wts_File,"w")) == NULL){
                goto_xy(0,23);
                printf(" *** WTS file could not be opened   ");
                }
        else{
        fprintf(filepointer,"%d %d\n",number_of_components,number_of_hidden);
        /* save input to hidden weights */
        for(i=1;i<=number_of_hidden;i++){
          for(j=1;j<=number_of_components;j++){
            fprintf(filepointer,"%.4f ",Hidden_Wts[j][i]);
            }
          fprintf(filepointer,"%.4f ",BiasH[i]);
          fprintf(filepointer,"\n");
          }

/* save hidden to output weights */
        for(i=1;i<=number_of_components;i++){
          for(j=1;j<=number_of_hidden;j++){
            fprintf(filepointer,"%.4f ",Output_Wts[j][i]);
            }
          fprintf(filepointer,"%.4f ",BiasO[i]);
          fprintf(filepointer,"\n");

}
        fclose(filepointer);
        }
}

/*****************************************************************************/
/* Update_Network()                                                          */
/*                                                                           */
/*     This is the "Artificial Neural Network" section of the program.       */
/* This routine uses "Backpropagation" as its learning method. The code      */
/* consists of two section. One section accomplishes the forward process-   */
/* ing. The second section accomplishes the "learning" if the "LEARNING"    */
/* flag is set. Since the error must be generated here anyway, RMS error     */
/* is also produced here.                                                    */
/*****************************************************************************/
Update_Network()
        {
        int i,j;
        float Sum, Terror ;

/* ACCOMPLISH FORWARD PROCESSING                                             */
/*****************************************************************************/

/* input layer to hidden layer processing */
        for(i=1;i<=number_of_hidden;i++){
          Sum = 0.0;
          for(j=1;j<=number_of_components;j++){
            Sum = Sum + Hidden_Wts[j][i] * Input_Data[j][1];
            }
          Sum = Sum + BiasH[i];     /* bias input */
        /* Sigmoid Functions --- your choice   */
```

```
            /* range is between 0 and 1      */
            Hidden_Output[i] = 1.0/(1.0+exp(-Sum));
            }

/* hidden layer to output layer */
            for(i=1;i<=number_of_components;i++){
               Sum = 0.0;
               for(j=1;j<=number_of_hidden;j++){
                  Sum = Sum + Output_Wts[j][i] * Hidden_Output[j];
                  }
               Sum = Sum + BiasO[i];        /* bias input */
               /* Sigmoid Functions --- your choice   */
               Output_Output[i] = 1.0/(1.0+exp(-Sum));
               }

/*          compute output error        (desired - actual)              */
            MSerror = 0.0;
            for (i=1;i<=number_of_components;i++){
               Output_Error[i] = Input_Data[i][2] - Output_Output[i];
               MSerror = MSerror + Output_Error[i] * Output_Error[i];
               Output_Error[i] = Output_Error[i] *
                           (1.0 - Output_Output[i]) * Output_Output[i];
               }

/*ROUTINES IF TRAINING IS ENABLED                  */
/**********************************************************************/ if(train_flag){
               Iterations = Iterations + 1;

/**********************************************************************/
/*       compute hidden layer error                                    */
/* This assigns portions of the output errors of each of the output to the */
/* hidden elements according to weights connecting the each output element*/
/* and each hidden element. The "(1 -A())*A()" term serves as the      */
/* derivative of the sigmoid function.                                 */
/**********************************************************************/ for (i=1;i<=number_of_hidden;i++){
               Hidden_Error[i] = 0.0;
               for(j=1;j<=number_of_components;j++){
                  Hidden_Error[i] = Hidden_Error[i] + Output_Error[j] *
                              Output_Wts[i][j];
                  }
               Hidden_Error[i] = Hidden_Error[i] *
                        (1.0 - Hidden_Output[i]) * Hidden_Output[i];
               }

/*          adjust hidden weights                                      */
/* This section adjust the weights from the hidden layer to the output */
/*    layer                                                            */ for (j=1;j<=number_of_components;j++){
               for (i=1;i<=number_of_hidden;i++){
                  DeltaOWts[i][j] = momentum * DeltaOWts[i][j] +
                     learn_rate * Output_Error[j] * Hidden_Output[i];
                  Output_Wts[i][j] = Output_Wts[i][j] + DeltaOWts[i][j];
                  }

DeltaOBias[j] = momentum * DeltaOBias[j] +
                     learn_rate * Output_Error[j];
               BiasO[j] = BiasO[j] + DeltaOBias[j];

}

/*          adjust input weights                                       */
/* This section adjust the weights from the input layer to the hidden layer*/
```

```
for (j=1;j<=number_of_hidden;j++){
    for (i=1;i<=number_of_components;i++){
        DeltaHWts[i][j] = momentum * DeltaHWts[i][j] +
            learn_rate * Hidden_Error[j] * Input_Data[i][1];
        Hidden_Wts[i][j] = Hidden_Wts[i][j] + DeltaHWts[i][j];
    }

DeltaHBias[j] = momentum * DeltaHBias[j] +
        learn_rate * Hidden_Error[j] -
        0.1 * (Hidden_Output[j]-0.5);
    BiasH[j] = BiasH[j] + DeltaHBias[j];
    }
}
```

What is claimed is:

1. A method for detecting and diagnosing faults of an object, comprising the steps of:
obtaining an emissivity map of said object, while said object is substantially in thermal equilibrium with its ambient environment, by capturing a basis thermal image, illuminating said object, capturing an illumination image while said object is illuminated, calculating a difference image between said basis thermal image and said illumination image, and using said difference image to determine an emissivity map at various points on said object;
heating said object;
obtaining a thermal image of said object during said heating step;
correcting said thermal image, using said emissivity map to compensate for varying emissivities on said object, such that an emissivity-corrected thermal image is obtained;
inputting data representing said emissivity-corrected thermal image to an artificial neural network, wherein said neural network has been previously trained to provide a certain output when said data is associated with a known fault; and
using said neural network to indicate whether a fault exists on said object.

2. The method of claim 1, and further comprising the step of preprocessing said emissivity-corrected thermal data, such that said emissivity-corrected thermal data is converted to device space data, in which particular locations are associated with a thermal feature at that location for input to said neural network.

3. The method of claim 1, wherein said object is an electronic circuit, and wherein said heating step is accomplished by applying power to said circuit.

4. The method of claim 1, wherein said substep of using said difference image to calculate an emissivity map comprises finding a maximum value of said difference image at a point of high reflectance on said object, and calculating the value of said difference image at said point of high reflectance.

5. The method of claim 4, further comprising the step of calculating the ratio of said difference image and said value of said difference image at said point of high reflectance.

6. The method of claim 1, wherein said substep of using said difference image to calculate an emissivity map comprises determining a point of known emissivity on said object and calculating a value of said difference image at said known point.

7. The method of claim 6, further comprising the step of calculating the ratio of said difference image and said value of said difference image at said known point.

8. A method of acquiring emissivity-corrected data representing thermal measurements at locations on an object, comprising the steps of:
obtaining an emissivity map of said object, while said object is substantially in thermal equilibrium with its environment, by capturing a basis thermal image while said object is not substantially illuminated by an external source, capturing an illumination image while said object is illuminated by an external source, calculating a difference image between said illumination image and said basis thermal image, and using said difference image to determine said emissivity map at various points on said object;
obtaining thermal image data representing a thermal image of said object, while said circuit is heated;
correcting said thermal image data, using said emissivity map to compensate for varying emissivities at different locations on said object, such that emissivity-corrected thermal image data is obtained.

9. The method of claim 8, wherein said object is an electronic circuit, and wherein said heating step is accomplished by applying power to said circuit.

10. The method of claim 8, wherein said step of using said difference image to determine an emissivity map comprises finding a maximum value of said difference image, wherein said maximum value represents a point of high reflectance on said object.

11. The method of claim 10, wherein said step of using said difference image to determine an emissivity map further comprises the step of calculating the ratio of said difference image and said maximum value.

12. The method of claim 8, wherein said step of using said difference image to determine an emissivity map comprises determining a value of said difference image at a point of known emissivity on said object.

13. The method of claim 12, wherein said step of using said difference image to determine an emissivity map further comprises the step of calculating the ratio of said difference image and said value of said difference image at said point of known emissivity.

* * * * *